(12) United States Patent
Oku

(10) Patent No.: US 7,990,778 B2
(45) Date of Patent: Aug. 2, 2011

(54) NONVOLATILE SEMICONDUCTOR MEMORY AND METHOD FOR TESTING THE SAME

(75) Inventor: Satoru Oku, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 56 days.

(21) Appl. No.: 12/591,878

(22) Filed: Dec. 3, 2009

(65) Prior Publication Data
US 2010/0142289 A1    Jun. 10, 2010

(30) Foreign Application Priority Data

Dec. 8, 2008 (JP) ................................. 2008-311970

(51) Int. Cl.
*G11C 7/00* (2006.01)

(52) U.S. Cl. ............... 365/189.09; 365/189.15; 365/201

(58) Field of Classification Search ............. 365/189.09, 365/189.15, 201
See application file for complete search history.

(56) References Cited

U.S. PATENT DOCUMENTS

| | | | | |
|---|---|---|---|---|
| 5,777,930 | A * | 7/1998 | Sugiura et al. | 365/189.11 |
| 6,977,849 | B2 * | 12/2005 | Tomishima | 365/189.09 |
| 7,633,815 | B2 * | 12/2009 | Ch'ng et al. | 365/189.11 |
| 2009/0323440 | A1 * | 12/2009 | Soma | 365/189.15 |

FOREIGN PATENT DOCUMENTS

JP    2000-173297    6/2000

* cited by examiner

*Primary Examiner* — Connie C Yoha
(74) *Attorney, Agent, or Firm* — McGinn IP Law Group, PLLC

(57) ABSTRACT

A nonvolatile semiconductor memory includes a nonvolatile memory array, a voltage generator circuit that generates a drive voltage which changes depending on a supply voltage and a trimming code, a control circuit that applies the generated drive voltage to the nonvolatile memory array, and a trimming code output circuit that outputs any one of plural trimming codes to the voltage generator circuit. The plural trimming codes include a test trimming code in addition to an appropriate trimming code for generating a desired drive voltage. The test trimming code is different from the appropriate trimming code, and used only in the test state. In the test state, the trimming code output circuit outputs the test trimming code to the voltage generator circuit, and the voltage generator circuit generates the drive voltage according to the test trimming code. In states other than the test state, the trimming code output circuit outputs the appropriate trimming code to the voltage generator circuit, and the voltage generator circuit generates the drive voltage according to the appropriate trimming code.

10 Claims, 7 Drawing Sheets

100: BURN-IN TEST DEVICE

NONVOLATILE SEMICONDUCTOR MEMORY AND METHOD FOR TESTING THE SAME

INCORPORATION BY REFERENCE

This application is based upon and claims the benefit of priority from Japanese Patent Application No. 2008-311970 which was filed on Dec. 8, 2008, the disclosure of which is incorporated herein in its entirety by reference.

BACKGROUND OF THE INVENTION

1. Field of the Invention

The present invention relates to a nonvolatile semiconductor memory and a method for testing the nonvolatile semiconductor memory. In particular, the present invention relates to a nonvolatile semiconductor memory that internally generates a drive voltage for data read and write, and a method for testing the nonvolatile semiconductor memory.

2. Description of Related Art

There have been known nonvolatile semiconductor memories such as a flash memory or an electrically erasable and programmable read only memory (EEPROM). A memory cell of the nonvolatile semiconductor memory of this type has a charge storage layer such as a floating gate. The data write and erase are executed by injecting electrons into the charge storage layer or extracting electrons from the charge storage layer. In this case, there is a need to apply a relatively high voltage to word lines and bit lines.

Problems unique to the nonvolatile semiconductor memory of this type include "write disturb". The write disturb unit that the high voltage to be applied at the time of writing or erasing data also affects unselected cells, thereby causing data in the affected unselected cells to be rewritten. Accordingly, in a screening process before shipment of products, there is a need to implement a write disturb test on respective chips. Also, in the screening process, the test of other cell characteristics is also implemented.

In the above characteristic test, there is a need to apply an appropriate voltage to the respective memory cells. In general, the nonvolatile internally generates the drive voltage for data read and write. For that purpose, the nonvolatile semiconductor memory is equipped with a voltage generator circuit for generating the drive voltage. For example, the high voltage required for data write and erase is generated by the voltage generator circuit such as a charge pump or a regulator. In testing the characteristics of the nonvolatile semiconductor memory, there is a need to generate an appropriate drive voltage by using the voltage generator circuit.

JP-A-2000-173297 discloses a technique for screening a dynamic random access memory (DRAM). The technique aims at reducing a time necessary for screening. According to the technique, a burn-in test is implemented for screening the DRAM. In the burn-in test, an internal voltage generated within the DRAM is made higher than that in a normal state, thereby reducing a stressing time. As a result, the screening time is reduced. In more detail, the DRAM includes a first step-down power supply unit, a second step-down power supply unit, a step-up power supply unit, a negative power supply unit, and a third step-down power supply unit. The first step-down power supply unit generates a first step-down voltage lower than a supply voltage in a normal state, and outputs the supply voltage in a test state. The second step-down power supply unit generates a second step-down voltage higher than the first step-down voltage in the normal state, and outputs the supply voltage in the test state. The step-up power supply unit generates a step-up voltage higher than the supply voltage in the normal state, and changes a level of the step-up voltage in the test state. The negative power supply unit generates a negative voltage in the normal state, and changes a level of the negative voltage in the test state. The third step-down power supply unit generates a third step-down voltage lower than the first step-down voltage, and changes a level of the third step-down voltage in the test state.

SUMMARY

However, the present inventor has recognized the following point. Namely, the nonvolatile semiconductor memory is equipped with the voltage generator circuit that generates the drive voltage for data read and write. The drive voltage generated by the voltage generator circuit depends on the supply voltage applied from the external. That is, an output of the voltage generator circuit has "supply voltage dependency".

In testing the characteristics of the nonvolatile semiconductor memory, it is desirable to control the drive voltage output from the voltage generator circuit in order to supply a desired load to the memory cell. In this case, because the drive voltage has the supply voltage dependency, it is conceivable to change the supply voltage with the aim of changing the drive voltage. However, there is a case in which the supply voltage cannot be easily changed. For example, in a burn-in tester for use in burn-in test, it is usually impossible to control the supply voltage to be supplied to the chip. Accordingly, there is desired a technique by which the output of the voltage generator circuit can be changed even if no supply voltage changes.

According to JP-A-2000-173297 described above, the internal voltage generated inside of the DRAM can be made different between in the normal state and in the burn-in test state. For example, the step-down power supply circuit is configured to output a voltage lower than the supply voltage in the normal state, and to output the supply voltage per se in response to a test signal. However, in order to realize the above-mentioned step-down power supply circuit, there is a need to change the configuration of the general step-down power supply circuit, and use a more complicated configuration. This leads to an increase in the costs.

The present invention seeks to solve one or more of the above problems, or to improve upon those problems at least in part.

In one exemplary embodiment, a nonvolatile semiconductor memory includes a nonvolatile memory array, a voltage generator circuit that generates a drive voltage which changes depending on a supply voltage and a trimming code, a control circuit that applies the generated drive voltage to the nonvolatile memory array, and a trimming code output circuit that outputs any one of plural trimming codes to the voltage generator circuit. The plural trimming codes include a test trimming code in addition to an appropriate trimming code for generating a desired drive voltage. The test trimming code is different from the appropriate trimming code, and used only in the test state. In the test state, the trimming code output circuit outputs the test trimming code to the voltage generator circuit, and the voltage generator circuit generates the drive voltage according to the test trimming code. In states other than the test state, the trimming code output circuit outputs the appropriate trimming code to the voltage generator circuit, and the voltage generator circuit generates the drive voltage according to the appropriate trimming code.

In another exemplary embodiment, a testing method for a nonvolatile semiconductor memory internally which generates a drive voltage that changes depending on a supply voltage and trimming codes includes a step of determining plural trimming codes. In this case, the plural trimming codes include a test trimming code in addition to an appropriate trimming code for generating a desired drive voltage. The test trimming code is different from the appropriate trimming code, and used only in the test state. The testing method further includes a step of generating the drive voltage according to the test trimming code among plural trimming codes, and a step of applying the generated drive voltage to a nonvolatile memory array of the nonvolatile semiconductor memory.

According to the present invention, in testing the nonvolatile semiconductor memory, it is possible to easily change the drive voltage generated by the voltage generator circuit without changing the supply voltage.

BRIEF DESCRIPTION OF THE DRAWINGS

The above and other purposes, advantages and features of the present invention will become more apparent from the following description of certain exemplary embodiments taken in conjunction with the accompanying drawings in which.

DETAILED DESCRIPTION OF THE EXEMPLARY EMBODIMENTS

The invention will now be described herein with reference to illustrative exemplary embodiments. Those skilled in the art will recognize that many alternative embodiments can be accomplished using the knowledge of the present invention, and that the invention is not limited to the exemplary embodiments illustrated for explanatory purposes.

First Exemplary Embodiment

A description will be given of a nonvolatile semiconductor memory and a method for testing the memory according to a first exemplary embodiment of the present invention with reference to the accompanying drawings.

1. Voltage Generator Circuit

A nonvolatile semiconductor memory according to the first exemplary embodiment is formed of a flash memory, an EEPROM, and so on, and internally generates a drive voltage for data read and write. To achieve this, the nonvolatile semiconductor memory according to the first exemplary embodiment is equipped with "a voltage generator circuit" for generating the drive voltage. The voltage generator circuit generally employs a charge pump or a voltage regulator.

Figure 1:
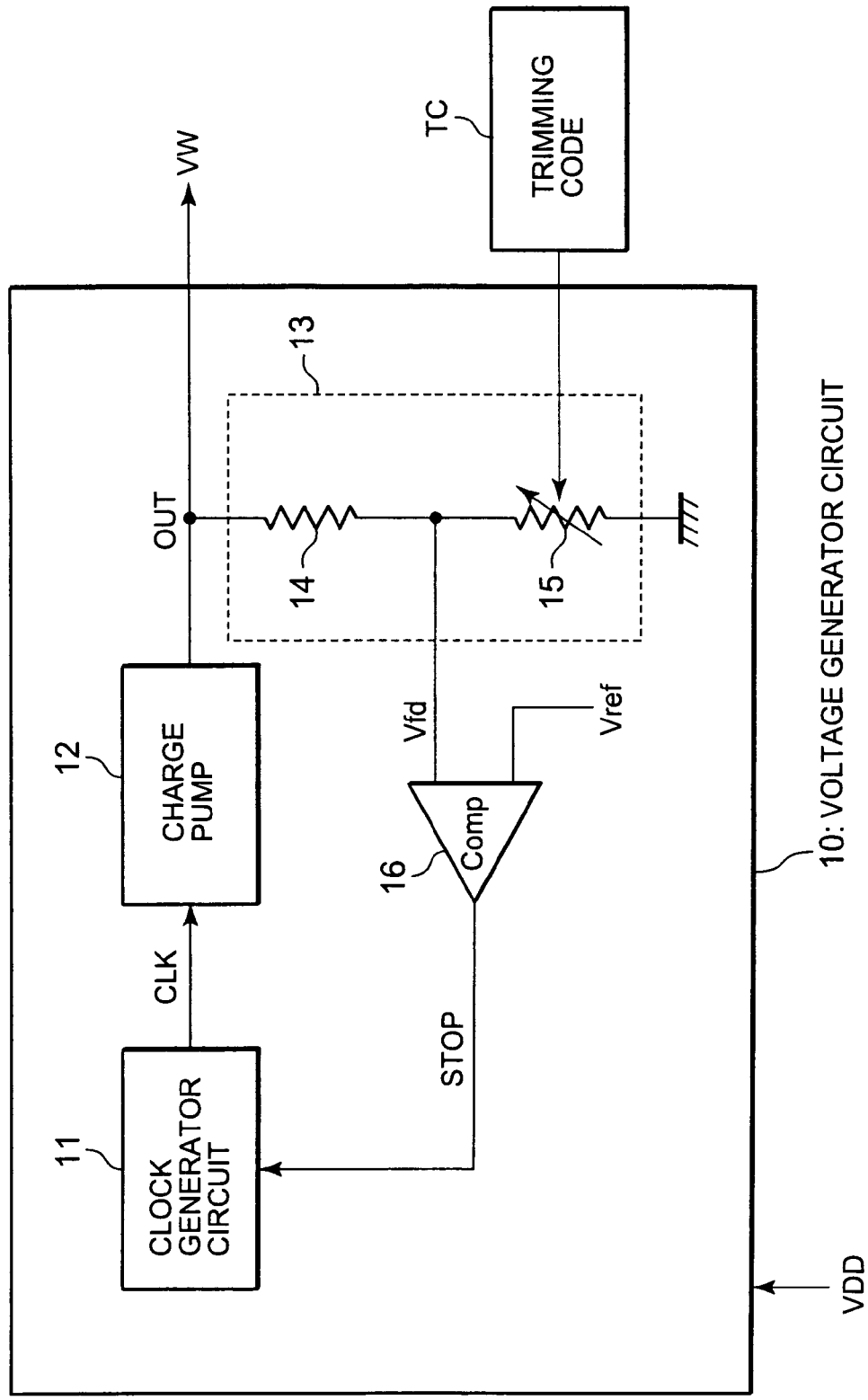
FIG. 1 is a block diagram illustrating an example of a voltage generator circuit according to a first exemplary embodiment of the present invention.

FIG. 1 is a block diagram illustrating an example of a voltage generator circuit 10 according to the first exemplary embodiment of the present invention. The voltage generator circuit 10 shown in FIG. 1 is a typical circuit using a charge pump. In more detail, the voltage generator circuit 10 includes a' clock generator circuit 11, a charge pump 12, a feedback resistor 13, a comparator circuit 16, and an output terminal OUT. Also, the voltage generator circuit 10 receives a supply voltage VDD from the external, and the respective circuits operate on the basis of the supply voltage VDD.

The clock generator circuit 11 generates a clock signal CLK, and outputs the clock signal CLK to the charge pump 12. The charge pump 12 steps up voltage on the basis of the clock signal CLK, and outputs a drive voltage VW to the output terminal OUT. The voltage generator circuit 10 outputs the drive voltage VW from the output terminal OUT. The drive voltage VW is used as a high voltage (write voltage) for data write, for example.

The feedback resistor 13 has a resistor 14 and a variable resistor 15 which are connected in series between the output terminal OUT and a ground terminal. A resistance value of the variable resistor 15 is variably set according to a trimming code TC. That is, a resistance ratio of the resistor 14 and the variable resistor 15 changes according to the trimming code TC. A feedback voltage Vfd is generated by resistive voltage division due to the feedback resistor 13. The feedback voltage Vfd depends on the drive voltage VW and the resistance ratio at the output terminal OUT. Accordingly, the feedback voltage Vfd depends on the drive voltage VW and the trimming code TC.

The comparator circuit 16 compares the feedback voltage Vfd with a reference voltage Vref, and outputs a stop signal STOP corresponding to the comparison result to the clock generator circuit 11. The stop signal STOP is a signal instructing the execution or stop of clock generation. For example, when the feedback voltage Vfd is higher than the reference voltage Vref, the stop signal STOP is activated, and the clock generator circuit 11 stops the generation of the clock signal CLK. As a result, the charge pump 12 also stops the step-up operation to reduce the drive voltage VW. When the drive voltage VW decreases, the feedback voltage Vfd also decreases. When the feedback voltage Vfd becomes lower than the reference voltage Vref, the stop signal STOP is inactivated, and the clock generator circuit 11 restarts the generation of the clock signal CLK. As a result, the charge pump 12 also restarts the step-up operation, and the drive voltage VW increases.

The above feedback operation causes the drive voltage VW to be kept to such a level that the feedback voltage Vfd becomes substantially equal to the reference voltage Vref. In other words, the feedback voltage Vfd becomes substantially equal to the reference voltage Vref, and the drive voltage VW reaches a level determined according to the reference voltage Vref and the above-mentioned resistance ratio. Accordingly, the resistance ratio is changed, thereby enabling the drive voltage VW to be changed. That is, the trimming code TC is changed, thereby enabling the drive voltage VW generated by the voltage generator circuit 10 to be changed. In this way, the trimming code TC can be regarded as information for regulating the output of the voltage generator circuit 10. The trimming code TC is allocated with digital data.

The drive voltage VW changes depending on not only the trimming code TC, but also the supply voltage VDD being an operating voltage. That is, the drive voltage VW generated by the voltage generator circuit 10 has "supply voltage dependency."

2. Appropriate Trimming Code and Test Trimming Code

There is a possibility that the drive voltage VW output from the voltage generator circuit 10 varies with manufacture variation with respect to each chip. For example, the manufacture variation of the reference voltage Vref causes a variation in the drive voltage VW among the chips. The variation in the drive voltage VW leads to a variation in the write characteristic or read characteristic among the chips. In order to suppress such characteristic variations, the drive voltage VW is finely adjusted for each chip after having manufacturing the chips. The adjusting process is generally called "trimming".

Figure 2:
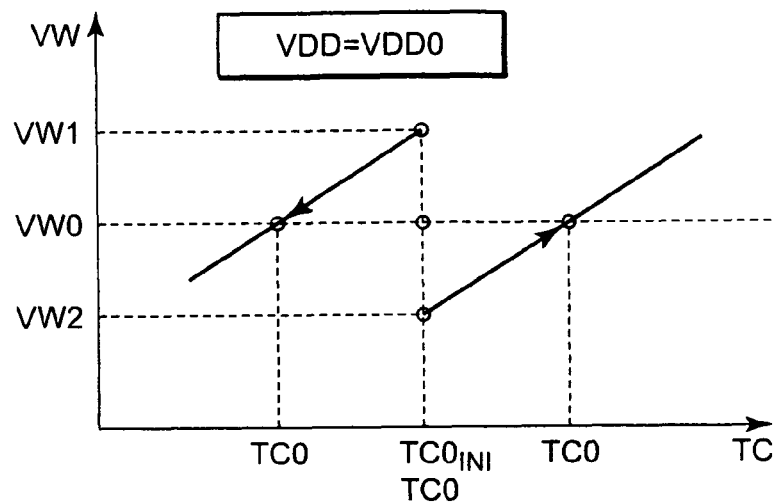
FIG. 2 is a conceptual diagram illustrating one method for determining a trimming code according to the first exemplary embodiment of the present invention.

The trimming of the drive voltage VW will be described with reference to FIG. 2. Referring to FIG. 2, the axis of ordinate represents the drive voltage VW output from the voltage generator circuit 10, and the axis of abscissa represents the trimming code TC. During the trimming process, the supply voltage VDD supplied to the voltage generator circuit 10 is set to a given supply voltage VDD0. The given supply voltage VDD0 is a typical supply voltage (designed value). Also, a target value (designed value) of the drive voltage VW is a given drive voltage VW0. As described above, the drive voltage VW changes depending on the trimming code TC. Accordingly, a certain trimming code TC can be determined such that the given drive voltage VW0 is output from the voltage generator circuit 10 (the trimming code TC is hereinafter referred to as "appropriate trimming code TCO"). More specifically, an arbitrary trimming code TCOINI is first input. When the drive voltage VW generated at this time is equal to the given drive voltage VW0, the appropriate trimming code TCO is TCOINI. Also, when the drive voltage VW generated at this time is VW1 (>VW0) higher than the given drive voltage VW0, the trimming code TC is changed so that the drive voltage VW decreases to the given drive voltage VW0. Likewise, when the drive voltage VW generated at this time is VW2 (<VW0) lower than the given drive voltage VW0, the trimming code TC is changed so that the drive voltage VW increases to the given drive voltage VW0. Through this procedure, the appropriate trimming code TCO can be determined.

As shown in FIG. 2, the appropriate trimming code TCO is determined such that the drive voltage VW becomes equal to VW0 when the supply voltage VDD is equal to VDD0. In other words, when the supply voltage VDD is equal to VDD0, and the trimming code TC is the appropriate trimming code TCO, the drive voltage VW output from the voltage generator circuit 10 becomes the given drive voltage VW0. In this way, the output of the voltage generator circuit 10 can be adjusted to the given drive voltage VW0 (target value).

The appropriate trimming code TCO is determined for each chip before shipment of products. There is a possibility that the determined appropriate trimming code TCO is different among the chips. After shipment of the products, the voltage generator circuits 10 in the respective chips can output the same drive voltage VW0 with the use of the respective appropriate trimming codes TCO. That is, the outputs of the voltage generator circuits 10 get equal to each other among the chips to suppress the variation in the drive voltage VW among the chips.

On the other hand, there is a need to execute the characteristic test of the nonvolatile semiconductor memory in a range of guaranteed supply voltages. In this case, because the drive voltage VW has the supply voltage dependency, there is a case in which a test must be conducted in a state where the supply voltage VDD is changed. However, there is a case in which the supply voltage VDD cannot be easily changed. For example, in a burn-in test device used in burn-in test, the supply voltage to be applied to the chips cannot be normally controlled.

Under the above circumstances, in the first exemplary embodiment, there is provided a technique by which the output of the voltage generator circuit 10 can be changed even if no supply voltage VDD changes. In other words, there is provided a technique by which "the supply voltage dependency of the drive voltage VW" can be recreated even if no supply voltage VDD changes.

Figure 3:
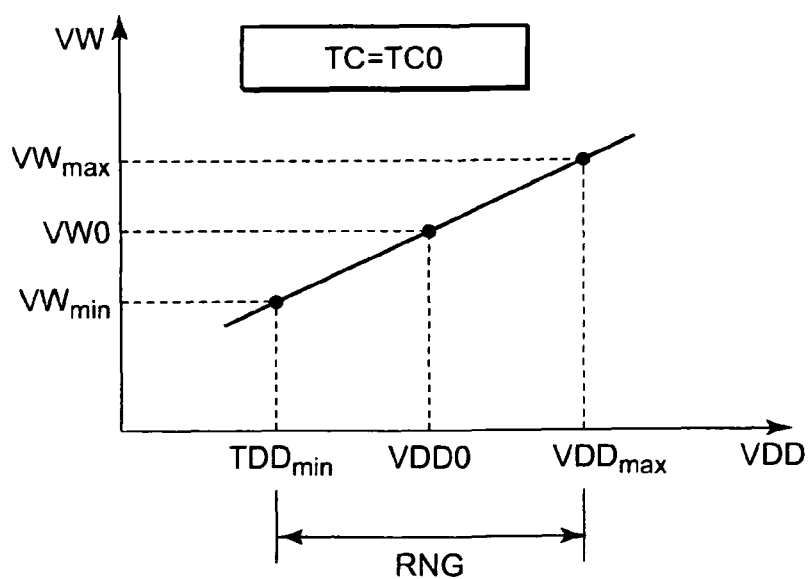
FIG. 3 is a conceptual diagram illustrating another method for determining the trimming code according to the first exemplary embodiment of the present invention.

Referring to FIG. 3, a description will be given of the measurement of the supply voltage dependency of the drive voltage VW. Referring to FIG. 3, the axis of ordinate represents the drive voltage VW output from the voltage generator circuit 10, and the axis of abscissa represents the supply voltage VDD to be applied to the voltage generator circuit 10. In this case, it is assumed that the guaranteed operating range RNG of the supply voltage VDD is VDDmin to VDDmax. The supply voltage VDDmax is an upper limit of the supply voltage VDD which is higher than the given supply voltage VDD0. On the other hand, the supply voltage VDDmin is a lower limit of the supply voltage VDD which is lower than the given supply voltage VDD0.

In measuring the supply voltage dependency, the trimming code TC is set to the appropriate trimming code TCO determined in FIG. 2. Then, the drive voltage VW output from the voltage generator circuit 10 is measured while the supply voltage VDD is being changed within the guaranteed operating range RNG. For example, when the supply voltage VDD is VDDmax, a drive voltage VWmax higher than the given drive voltage VW0 is generated by the voltage generator circuit 10. Also, when the supply voltage VDD is VDDmin, a drive voltage VWmin lower than the given drive voltage VW0 is generated by the voltage generator circuit 10. Then, those drive voltages VWmax and VWmin are measured, and the measured values are stored in a given storage device.

Figure 4:
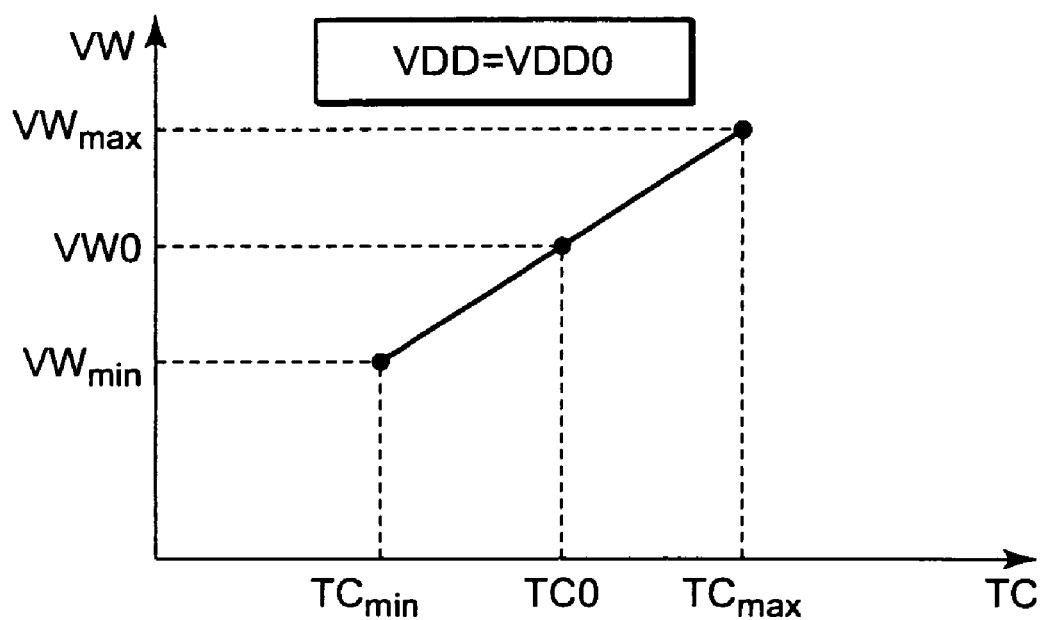
FIG. 4 is a conceptual diagram illustrating still another method for determining the trimming code according to the first exemplary embodiment of the present invention.

Subsequently, when the supply voltage VDD is equal to the given supply voltage VDD0, the trimming code TC is determined such that the drive voltage VW becomes equal to the drive voltages VWmax and VWmin. That is, the trimming code TC is determined such that the drive voltages VWmax and VWmin can be recreated even if the supply voltage VDD is the given supply voltage VDD0. Referring to FIG. 4, such a method for determining the trimming code TC will be described.

Referring to FIG. 4, the axis of ordinate represents the drive voltage VW output from the voltage generator circuit 10, and the axis of abscissa represents the trimming code TC. The supply voltage VDD to be applied to the voltage generator circuit 10 is set to the given supply voltage VDD0. In this case, as in the case of FIG. 2, the trimming code TC can be determined such that the drive voltage VWmax or VWmin is output from the voltage generator circuit 10. More specifically, as shown in FIG. 4, the trimming code TCmax is determined such that the drive voltage VW becomes equal to VWmax when the supply voltage VDD is equal to VDD0. The trimming code TCmax is hereinafter referred to as "first test trimming code". Also, the trimming code TCmin is determined such that the drive voltage VW becomes equal to VWmin when the supply voltage VDD is equal to VDD0. The trimming code TCmin is hereinafter referred to as "second test trimming code".

When the supply voltage VDD is equal to VDD0, and the trimming code TC is the first test trimming code TCmax, the drive voltage VW output from the voltage generator circuit 10 becomes the drive voltage VWmax higher than the given drive voltage VW0. Also, when the supply voltage VDD is equal to VDD0, and the trimming code TC is the second test trimming code TCmin, the drive voltage VW output from the voltage generator circuit 10 becomes the drive voltage VWmax lower than the given drive voltage VW0. In this way, the output of the voltage generator circuit 10 can be changed even if the supply voltage VDD is increased or decreased. That is, the supply voltage dependency of the drive voltage VW can be recreated even if no supply voltage VDD changes.

The test trimming codes TCmax and TCmin are specific trimming codes different from the above-mentioned appropriate trimming code TCO. Then, the test trimming codes TCmax and TCmin are used only in the characteristic test state of the nonvolatile semiconductor memory, but not used in the normal state. The test trimming codes TCmax and TCmin are used in the characteristic test state, thereby enabling the supply voltage dependency of the drive voltage VW to be recreated even if no supply voltage VDD changes. In other words, the trimming code TC is changed instead of the supply voltage VDD, thereby making it possible to control the drive voltage VW in the characteristic test state.

Also, the supply voltage dependency of the drive voltage VW is different among the chips. Accordingly, the test trimming codes TCmax and TCmin are determined for each chip. There is a possibility that the test trimming codes TCmax and TCmin to be determined are different among the chips. The use of such test trimming codes TCmax and TCmin enables the respective supply voltage dependencies to be recreated in the respective chips.

As has been described above, according to the first exemplary embodiment, plural trimming codes TC including the appropriate trimming code TCO and the test trimming codes TCmax, TCmin are prepared. The plural trimming codes TC are determined for each chip. Then, the use of the plural trimming codes TC enables the drive voltage VW to be controlled without any change in the supply voltage VDD.

In the above example, three kinds of trimming codes TCO, TCmax, and TCmin have been described. However, the present invention is not limited by or to this configuration. It is only necessary to prepare an arbitrary number of test trimming codes in addition to the appropriate trimming code TCO.

3. Nonvolatile Semiconductor Memory and its Operation
3-1. Configuration

Figure 5:
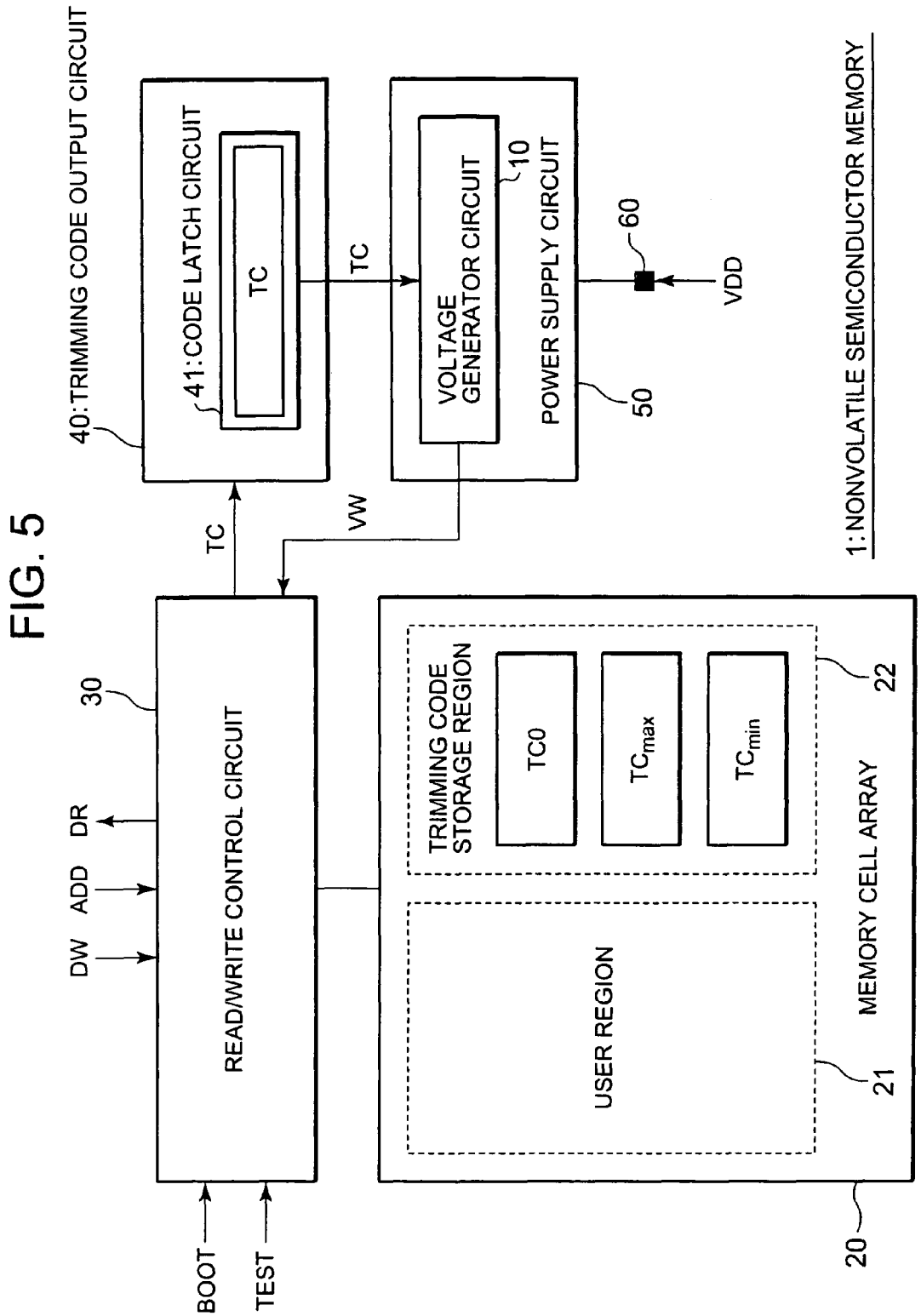
FIG. 5 is a block diagram illustrating the configuration of a nonvolatile semiconductor memory according to the first exemplary embodiment of the present invention.

FIG. 5 is a block diagram showing a configuration example of a nonvolatile semiconductor memory 1 according to the first exemplary embodiment. The nonvolatile semiconductor memory 1 includes a voltage generator circuit 10, a memory cell array 20, a read/write control circuit 30, a trimming code output circuit 40, a power supply circuit 50, and a power supply terminal 60.

The memory cell array 20 includes plural memory cells which are arranged in an array (not shown). Each memory cell is nonvolatile, and has a charge storage layer such as a floating gate. Data write and erase are executed by injecting electrons in the charge storage layer, or extracting electrons from the charge storage layer. A memory region of the memory cell array 20 includes a user region 21 and a trimming code storage region 22. The user region 21 is used by a user of the nonvolatile semiconductor memory 1. The trimming code storage region 22 is a dedicated memory region in which the trimming codes TC are stored, and addresses thereof are determined in advance. In an example of FIG. 5, the above-mentioned plural trimming codes TCO, TCmax, and TCmin are stored in the trimming code storage region 22.

The read/write control circuit 30 controls data read and data write with respect to the memory cell array 20 (memory cells). More specifically, the read/write control circuit 30 receives an address signal ADD that designates a target memory cell, and accesses the target memory cell designated by the address signal ADD. In data read, the read/write control circuit 30 reads data recorded in the target memory cell, and outputs read data DR to the external. In data write (including data erase), the read/write control circuit 30 receives write data DW from the external, and writes the write data DW into the target memory cell. The drive voltage VW for data read/write is generated by the above-mentioned voltage generator circuit 10. The read/write control circuit 30 applies the generated drive voltage VW to the memory cell array 20 to read and write data.

Also, the read/write control circuit 30 can read the trimming codes TC stored in the trimming code storage region 22 of the memory cell array 20. The address of each trimming code TC is determined in advance. Address information indicative of that address may be supplied from the external, or may be recorded in a nonvolatile memory or ROM disposed within the read/write control circuit 30 in advance. The read/write control circuit 30 reads any one of the plural trimming codes TCO, TCmax, and TCmin, depending on the situation. Then, the read/write control circuit 30 outputs the read trimming code TC to the trimming code output circuit 40.

The trimming code output circuit 40 receives each trimming code TC from the read/write control circuit 30, and outputs the trimming code to the voltage generator circuit 10. For example, the trimming code output circuit 40 has a code latch circuit 41. The code latch circuit 41 latches the trimming code TC, and outputs the trimming code TC to the voltage generator circuit 10. In the first exemplary embodiment, because three kinds of trimming codes TCO, TCmax, and TCmin are prepared, the trimming code output circuit 40 outputs any one of those trimming codes TCO, TCmax, and TCmin to the voltage generator circuit 10, depending on the situation.

The supply voltage circuit 50 generates a voltage necessary for the operation of the nonvolatile semiconductor memory, and applies the necessary voltage to each circuit. In particular, the power supply circuit 50 includes the voltage generator circuit 10 shown in FIG. 1. As described above, the voltage generator circuit 10 generates the drive voltage VW which changes depending on the supply voltage VDD and the trimming code TC. The supply voltage VDD is applied from the external through the power supply terminal 60. The trimming code TC is supplied from the trimming code output circuit 40. Then, the voltage generator circuit 10 applies the generated drive voltage VW to the read/write control circuit 30.

3-2. Test Method

Figure 6:
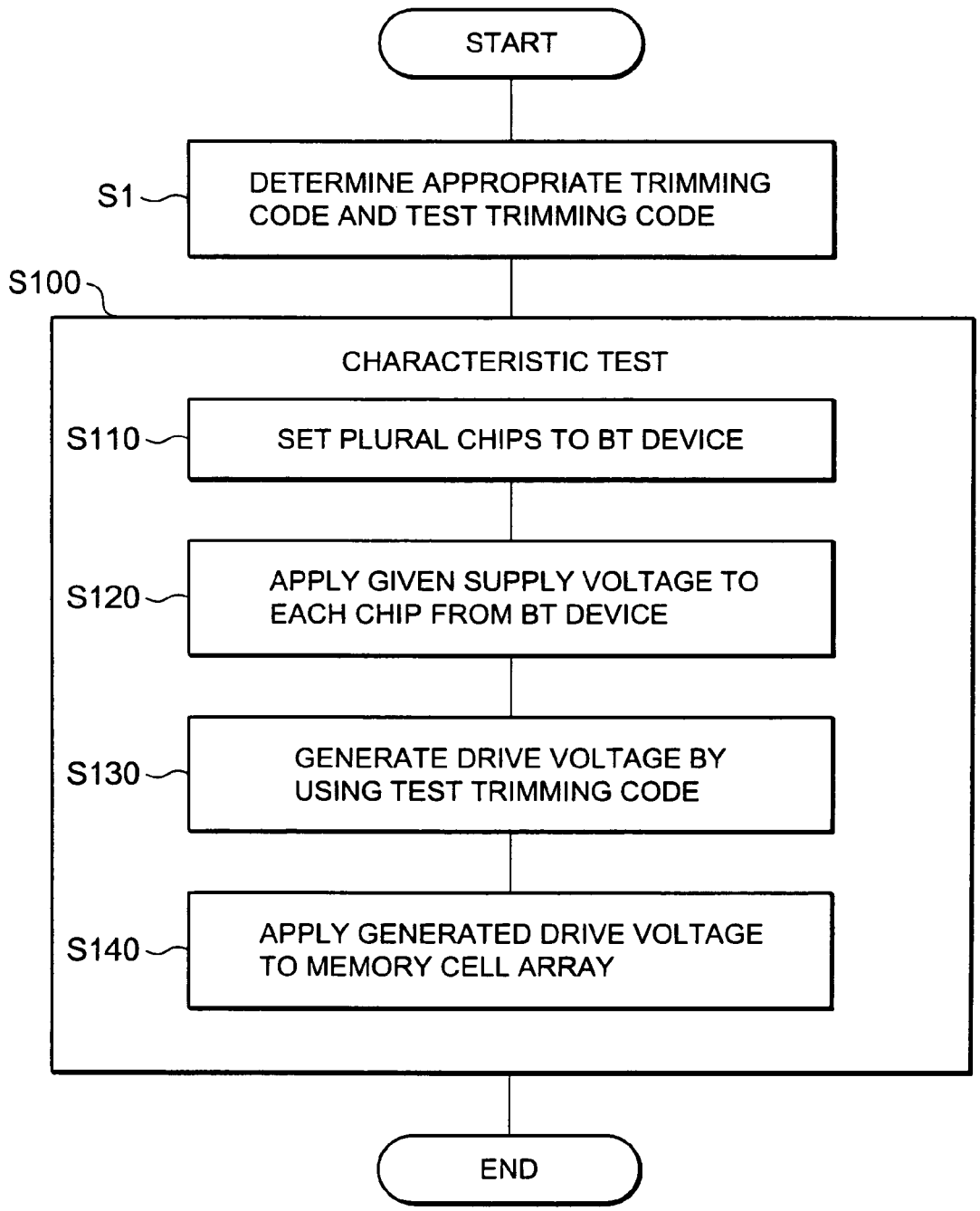
FIG. 6 is a flowchart illustrating a method for testing the nonvolatile semiconductor memory according to the first exemplary embodiment of the present invention.

Subsequently, a description will be given of a method of testing the nonvolatile semiconductor memory 1 according to the first exemplary embodiment. FIG. 6 is a flowchart illustrating the test method.

Step S1:

The plural trimming codes TCO, TCmax, and TCmin are determined in advance according to the method described with reference to FIGS. 2 to 4. The determined trimming codes TCO, TCmax, and TCmin are stored in the trimming code storage region 22 of the memory cell array 20.

Step S100:

Subsequently, the characteristic test of the nonvolatile semiconductor memory 1 is implemented. In the first exemplary embodiment, for example, the characteristic test is implemented with the use of the burn-in test device. In that case, the characteristic test can be implemented on the plural nonvolatile semiconductor memories (chips) 1 at the same time, which is preferable from the viewpoint of reducing the test costs.

Figure 7:
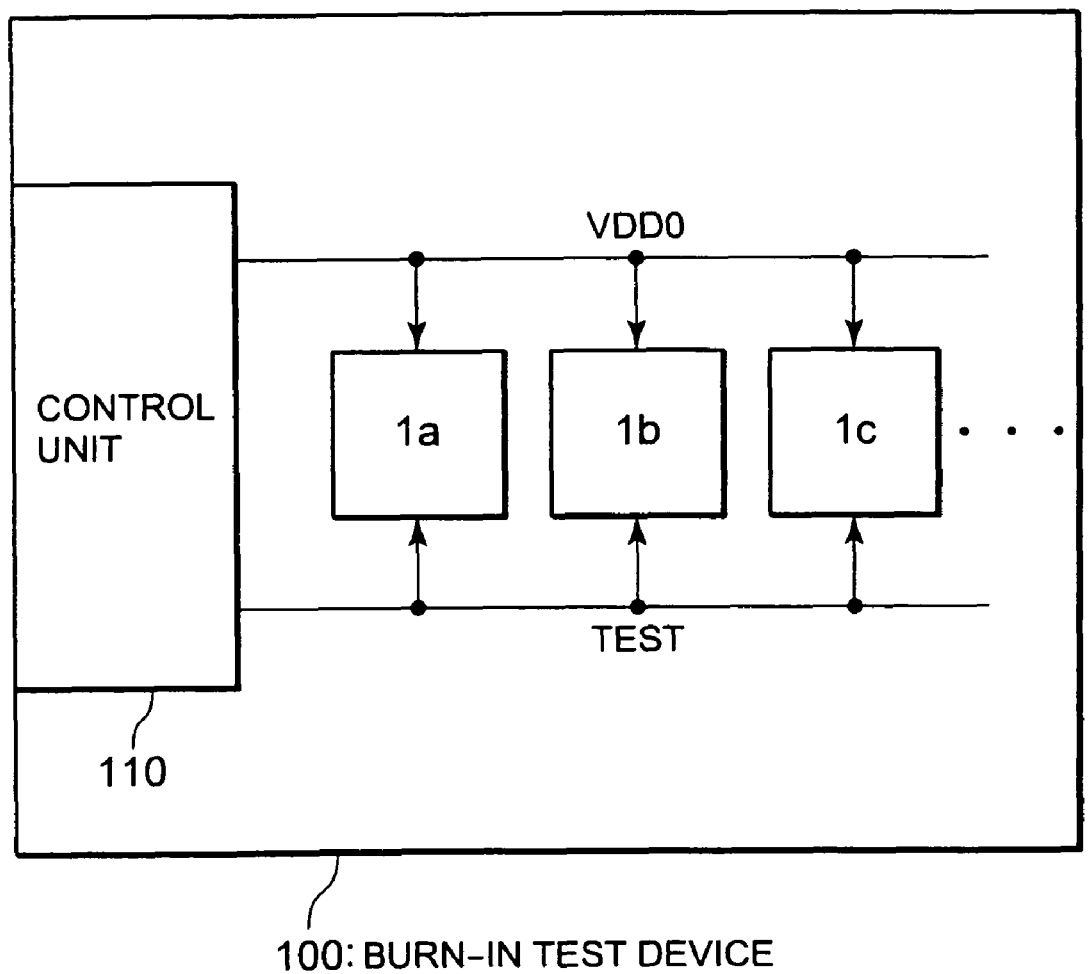
FIG. 7 is a conceptual diagram illustrating a method for testing the nonvolatile semiconductor memory according to the first exemplary embodiment of the present invention.

Step S110:

As shown in FIG. 7, plural nonvolatile semiconductor memories (chips) 1a to 1c are stored (set) in a burn-in test device 100. A control unit 110 of the burn-in test device 100 is a device for controlling the test, and can supply the supply voltage VDD and a test control signal TEST to an object to be tested. The burn-in test device 100 cannot change the supply voltage VDD which is applied to the object to be tested.

Step S120:

The control unit 110 of the burn-in test device 100 applies the supply voltage VDD to each nonvolatile semiconductor memory 1 to be tested. In the first exemplary embodiment, the above-mentioned given supply voltage VDD0 is applied to each nonvolatile semiconductor memory 1 from the burn-in test device 100. The given supply voltage VDD0 is applied to the voltage generator circuit 10 of each nonvolatile semiconductor memory 1 through the power supply terminal 60.

Step S130:

Also, the control unit 110 of the burst-in test device 100 supplies the test control signal TEST corresponding to the test contents to each nonvolatile semiconductor memory 1. The read/write control circuit 30 of each nonvolatile semiconductor memory 1 reads the trimming code TC corresponding to the test contents from the memory cell array 20 in response to the test control signal TEST. For example, in the write disturb test, in order to apply a high stress, the first test trimming code TCmax is read. Also, for the write/erase characteristic test, the second test trimming code TCmin may be read. This is because in the write/erase characteristic test, the test becomes lax when a high drive voltage VW is applied. Further, the appropriate trimming code TCO may be read depending on the circumstances. The read/write control circuit 30 outputs the read test trimming code to the trimming code output circuit 40.

The code latch circuit 41 of the trimming code output circuit 40 latches the read test trimming code, and outputs the test trimming code to the voltage generator circuit 10. The voltage generator circuit 10 generates the drive voltage VW according to the test trimming code output from the trimming code output circuit 40. In this example, the supply voltage VDD is the given supply voltage VDD0. Accordingly, when the trimming code TC is the first test trimming code TCmax, the voltage generator circuit 10 generates the drive voltage VWmax higher than the given drive voltage VW0. Also, when the trimming code TC is the second test trimming code TCmin, the voltage generator circuit 10 generates the drive voltage VWmin lower than the given drive voltage VW0.

Step S140:

The read/write control circuit 30 of each nonvolatile semiconductor memory 1 applies the drive voltage VW generated by the voltage generator circuit 10 to the memory cell array (memory cells) 20. For example, when the trimming code TC is the first test trimming code TCmax, the drive voltage VWmax higher than the given drive voltage VW0 is applied. Also, when the trimming code TC is the second test trimming code TCmin, the drive voltage VWmin lower than the given drive voltage VW0 is applied. In this way, the write disturb test and the write/erase characteristic test of each nonvolatile semiconductor memory 1 can be implemented.

As has been described above, the use of the test trimming code corresponding to the test contents enables the appropriate drive voltage VW to be applied to each chip. That is, the drive voltage VW can be appropriately controlled for each chip according to the test contents. In this case, it is unnecessary to change the supply voltage VDD in order to control the drive voltage VW. This is because the supply voltage dependency of the drive voltage VW can be recreated by using the test trimming code. Because there is no need to change the supply voltage VDD, the characteristic test can be implemented by using the burn-in test device 100 with the voltage applied to the chip being fixed. In that case, the characteristic test related to a large number of chips can be implemented in a lump, thereby making it possible to reduce the test costs.

3-3. Use by the User

In the user's use after shipment of products, the appropriate trimming code TCO is always used. For example, when the nonvolatile semiconductor memory 1 starts, the read/write control circuit 30 reads the appropriate trimming code TCO from the trimming code storage region 22 of the memory cell array 20 in response to a boot signal BOOT. Then, the read/write control circuit 30 outputs the read appropriate trimming code TCO to the trimming code output circuit 40. The code latch circuit 41 of the trimming code output circuit 40 latches the read appropriate trimming code TCO, and outputs the appropriate trimming code TCO to the voltage generator circuit 10. The voltage generator circuit 10 generates the drive voltage VW according to the appropriate trimming code TCO. The read/write control circuit 30 reads and writes data by using the generated drive voltage VW.

4. Effects

According to the first exemplary embodiment, the plural trimming codes TC are prepared. More specifically, the test trimming codes (TCmax, TCmin) are prepared in addition to the appropriate trimming code TCO. In testing the characteristics of the nonvolatile semiconductor memory 1, the use of the test trimming code enables the drive voltage VW to be controlled without changing the supply voltage VDD. That is, the supply voltage dependency of the drive voltage VW can be recreated even if no supply voltage VDD changes.

One advantage of the first exemplary embodiment resides in that the above effect can be obtained even if the general voltage generator circuit 10 shown in FIG. 1 is used. This is because the trimming code TC is used for control of the drive voltage VW in the characteristic test state. In general, only the appropriate trimming code TCO is prepared as the trimming code TC. However, in the first exemplary embodiment, the test trimming codes (TCmax, TCmin) are prepared in addition to the appropriate trimming code TCO. The appropriate drive voltage VW necessary for the characteristic test can be realized by only appropriately switching over the trimming codes TC. There is no need to add a switch circuit and a switch control signal for switching over the drive voltage VW between the user's use state and the characteristic test state to the voltage generator circuit 10. The voltage generator circuit 10 that generates the drive voltage VW can include a typical circuit shown in FIG. 1, which is preferable from the viewpoints of costs.

Also, the supply voltage dependency of the drive voltage VW is different among the chips. According to the first exemplary embodiment, the test trimming codes (TCmax, TCmin) are appropriately determined for each chip, taking the supply voltage dependency into consideration. There is a possibility that the determined test trimming code is different among the chips. The use of such test trimming codes enables the respective supply voltage dependency to be recreated in the respective chips. That is, in the characteristic test state, the appropriate drive voltage VW can be applied to each chip.

As an example, let us consider the write disturb test. In the write disturb test, for the purpose of investigating the write disturb resistance of each cell, a high stress is applied to each cell. When such a high stress is as excessive as exceeding the margin, it is determined that the chip is defective. Depending on the situations, the defective chip determination frequently occurs, and the yield is deteriorated. In the first exemplary embodiment, the appropriate drive voltage VW can be applied to each chip by using the test trimming code. Hence, an excessive stress is prevented from being applied to each chip. As a result, the defective chip determination is suppressed, and the yield is prevented from being deteriorated.

The same concept can be applied to the write/erase characteristics. That is, when write and erase are executed in a state where a low stress is applied, a write/erase time longer than a desired time is required, and it is determined that the chip is defective, thereby deteriorating the yield. However, in the first exemplary embodiment, the appropriate drive voltage VW can be applied to each chip by using the test trimming code. Hence, an excessive stress is prevented from being applied to each chip. As a result, the defective chip determination is suppressed, and the yield is prevented from being deteriorated.

Also, according to the first exemplary embodiment, the characteristic test can be implemented by using the burn-in test device 100 with the voltage applied to the chip being fixed. This is because there is no need to change the supply voltage VDD in order to obtain the appropriate drive voltage VW necessary for the characteristic test. The characteristic test related to a large number of chips can be implemented in a lump because the burn-in test device 100 can be used. As a result, the test costs are reduced.

Also, the first exemplary embodiment can be applied to the characteristic test using an LSI tester. For example, there has been known a method of transferring the test code to a nonvolatile memory built in the chip from the LSI tester by using a JTAG (joint test action group) interface, and executing a BIST (built-in self test) according to the test code. When the supply voltage VDD must be changed for each test, up to now, there has been a need to cut off the power supply once for each test as the power supply serge countermeasure. Accordingly, there is a need to transfer the test code again every time the supply power is cut off and returned. However, according to the first exemplary embodiment, even in such a case, there is no need to change the supply voltage VDD. This is because even if no supply voltage VDD changes, the same drive voltage VW as that when the supply voltage VDD changes is realized within the chip. Accordingly, there is no need to cut off the power supply for each test, and there is no need to again transfer the test code every time the power supply is cut off. Therefore, the test efficiency is improved.

Second Exemplary Embodiment

Figure 8:
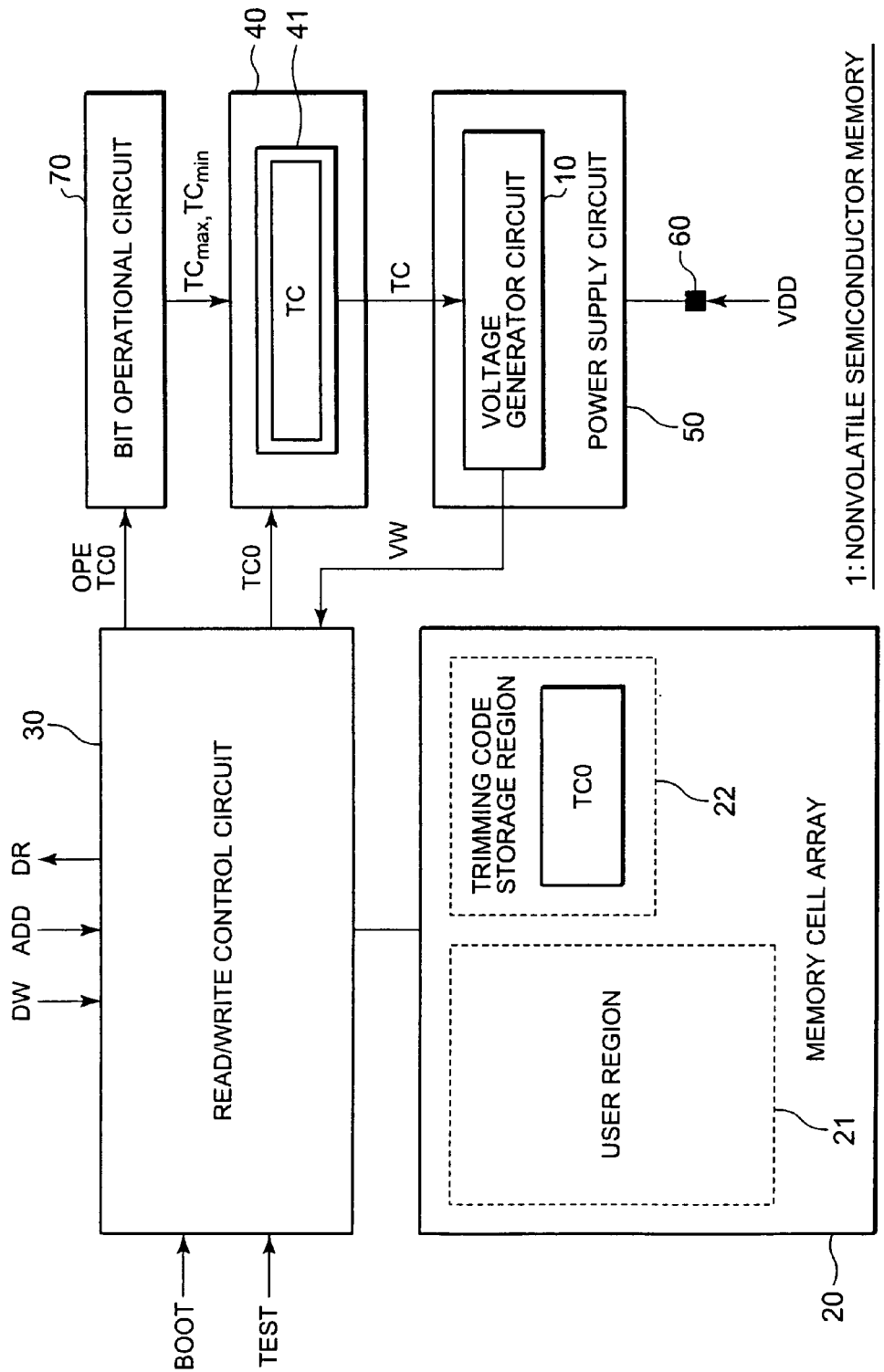
FIG. 8 is a block diagram illustrating a modification of the nonvolatile semiconductor memory according to a second exemplary embodiment of the present invention.

FIG. 8 shows a nonvolatile semiconductor memory 1 according to a second exemplary embodiment. In the second exemplary embodiment, only the appropriate trimming code TCO is stored in the trimming code storage region 22 of the memory cell array 20. On the other hand, a bit operational circuit 70 is added as compared with the configuration shown in FIG. 5. The bit operational circuit 70 converts the appropriate trimming code TCO into the test trimming code TCmax or TCmin through bit operation (code up/code down). The bit operational circuit 70 is realized by a shift register, for example.

In testing the nonvolatile semiconductor memory 1, the read/write control circuit 30 reads the appropriate trimming code TCO from the memory cell array 20 in response to the test control signal TEST. Then, the read/write control circuit 30 outputs the read appropriate trimming code TCO to the bit operational circuit 70. Also, the read/write control circuit 30 outputs an operation control signal OPE corresponding to the test contents indicated by the test control signal TEST to the bit operational circuit 70.

The bit operational circuit 70 receives the read appropriate trimming code TCO and the operation control signal OPE. Then, the bit operational circuit 70 converts the received appropriate trimming code TCO into the test trimming code (TCmax or TCmin) through bit operation. The contents of the bit operation (code up/code down) are determined on the basis of the test contents, and designated by the operation control signal OP. Accordingly, the bit operation circuit 70 can generate the test trimming code corresponding to the test contents from the appropriate trimming code TCO according to the operation control signal OP. Then, the bit operational circuit 70 outputs the obtained test trimming code to the trimming code output circuit 40.

The code latch circuit 41 of the trimming code output circuit 40 latches the test trimming code output from the bit operational circuit 70, and outputs the test trimming code to the voltage generator circuit 10. The voltage generator circuit 10 generates the drive voltage VW according to the test trimming code output from the trimming code output circuit 40. Others are identical with those of the first exemplary embodiment.

In the user's use after shipment of products, the read/write control circuit 30 reads the appropriate trimming code TCO from the memory cell array 20 in response to the boot signal BOOT. Then, the read/write control circuit 30 outputs the read appropriate trimming code TCO to the trimming code output circuit 40. The code latch circuit 41 of the trimming code output circuit 40 latches the read appropriate trimming code TCO, and outputs the appropriate trimming code TCO to the voltage generator circuit 10. The voltage generator circuit 10 generates the drive voltage VW according to the appropriate trimming code TCO.

Although the invention has been described above in connection with several exemplary embodiments thereof, it will be appreciated by those skilled in the art that those exemplary embodiments are provided solely for illustrating the invention, and should not be relied upon to construe the appended claims in a limiting sense.

Further, it is noted that, notwithstanding any claim amendments made hereafter, applicant's intent is to encompass equivalents all claim elements, even if amended later during prosecution.

What is claimed is:

1. A nonvolatile semiconductor memory, comprising:
    a nonvolatile memory array;
    a voltage generator circuit that generates a drive voltage which changes depending on a supply voltage and a trimming code;
    a control circuit that applies the generated drive voltage to the nonvolatile memory array; and
    a trimming code output circuit that outputs any one of a plurality of trimming codes to the voltage generator circuit,
    wherein the plurality of trimming codes includes:
        an appropriate trimming code for generating a desired drive voltage; and
        a test trimming code which is different from the appropriate trimming code, and used only in a test state,
    wherein, in the test state, the trimming code output circuit outputs the test trimming code to the voltage generator circuit, and the voltage generator circuit generates the drive voltage according to the test trimming code, and wherein, in a case other than the test state, the trimming code output circuit outputs the appropriate trimming code to the voltage generator circuit, and the voltage generator circuit generates the drive voltage according to the appropriate trimming code.

2. The nonvolatile semiconductor memory according to claim 1,
wherein when the supply voltage is equal to a given supply voltage, and the trimming code is the appropriate trimming code, the drive voltage is a given drive voltage,
wherein when the supply voltage is a first supply voltage different from the given supply voltage, and the trimming code is the appropriate trimming code, the drive voltage is a first drive voltage different from the given drive voltage, and
wherein when the supply voltage is equal to the given supply voltage, and the trimming code is the test trimming code, the drive voltage is the first drive voltage.

3. The nonvolatile semiconductor memory according to claim 2,
wherein in the test state, the given supply voltage is applied to the voltage generator circuit, and the voltage generator circuit generates the first drive voltage on the basis of the test trimming code and the given supply voltage.

4. The nonvolatile semiconductor memory according to claim 3,
wherein in the test state, the nonvolatile semiconductor memory is stored in a burn-in test device, and the given supply voltage is applied to the voltage generator circuit from the burn-in test device.

5. The nonvolatile semiconductor memory according to claim 1,
wherein the plurality of trimming codes is stored in the nonvolatile memory array,
wherein in the test state, the trimming code output circuit outputs the test trimming codes read from the nonvolatile memory array to the voltage generator circuit, and
wherein in states other than the test state, the trimming code output circuit outputs the appropriate trimming code read from the nonvolatile memory array to the voltage generator circuit.

6. The nonvolatile semiconductor memory according to claim 1, further comprising:
an operational circuit that converts the appropriate trimming code into the test trimming code,
wherein the appropriate trimming code is stored in the nonvolatile memory array,
wherein in the test state, the operational circuit converts the appropriate trimming code read from the nonvolatile memory array into the test trimming code, and the trimming code output circuit outputs the test trimming code output from the operational circuit to the voltage generator circuit, and
wherein in states other than the test state, the trimming code output circuit, outputs the appropriate trimming code read from the nonvolatile memory array to the voltage generator circuit.

7. A method of testing a nonvolatile semiconductor memory, the nonvolatile semiconductor memory internally generating a drive voltage that changes depending on a supply voltage and trimming codes, the method comprising:
determining a plurality of the trimming codes including an appropriate trimming code for generating a desired drive voltage, and a test trimming code which is different from the appropriate trimming code and used only in the test state;
generating the drive voltage according to the test trimming code among the plurality of trimming codes; and
applying the generated drive voltage to a nonvolatile memory array of the nonvolatile semiconductor memory.

8. The method according to claim 7,
wherein the determining comprises:
determining the appropriate trimming code so that the drive voltage becomes equal to a given drive voltage when the supply voltage is equal to a given supply voltage;
measuring, as a first drive voltage, the drive voltage generated when the trimming code is the determined appropriate trimming code, and the supply voltage is a first supply voltage different from the given supply voltage; and
determining the test trimming code so that the drive voltage becomes equal to the measured first drive voltage when the supply voltage is equal to the given supply voltage.

9. The method according to claim 8, further comprising:
implementing a characteristic test of the nonvolatile semiconductor memory by using a burn-in test device,
wherein the implementing includes:
applying the given supply voltage to the nonvolatile semiconductor memory from the burn-in test device;
generating the drive voltage; and
applying the generated drive voltage, and
wherein the generating comprises:
generating the first drive voltage on the basis of the test trimming code and the given supply voltage.

10. The method according to claim 9,
wherein the characteristic test is implemented on the plurality of nonvolatile semiconductor memories at the same time.

* * * * *